United States Patent [19]
Yamaguchi

[11] Patent Number: 5,596,651
[45] Date of Patent: Jan. 21, 1997

[54] SYSTEM AND METHOD FOR ELECTRONIC VOLUME CONTROL OF AUDIO SIGNALS

[75] Inventor: Hisashi Yamaguchi, Suwa, Japan

[73] Assignee: Seiko Epson Corporation, Tokyo, Japan

[21] Appl. No.: 83,791

[22] Filed: Jun. 25, 1993

[30] Foreign Application Priority Data

Jun. 25, 1992  [JP]  Japan .................................. 4-167864

[51] Int. Cl.$^6$ .................................................. H03G 3/00
[52] U.S. Cl. ........................................ 381/104; 381/107
[58] Field of Search .................................... 381/104, 105, 381/106, 107, 108, 109; 84/627, 663, 665, 633

[56] References Cited

U.S. PATENT DOCUMENTS

| 5,189,705 | 2/1993 | Lavaud | 381/104 |
| 5,303,371 | 4/1994 | Nakajima | 381/109 |

*Primary Examiner*—Wing F. Chan
*Assistant Examiner*—Huyen D. Le
*Attorney, Agent, or Firm*—W. Glen Johnson

[57] ABSTRACT

A system and method for reducing switching noise generated when an audio signal envelope is abruptly changed provides for gradual change of the audio signal envelope from one level to another. This gradual change over time in the audio signal envelope can be either near-linear or logarithmic. The system has a volume control register for storing a digital value representative of the envelope magnitude, an up/down counter initialized to a predetermined value, a comparator for comparing the contents of the volume control register and the up/down counter, and a digital-to-analog converter (D/A) which produces the audio signal envelope. The up/down counter output forms the input to the D/A. If the value of the volume control register is larger than the value of the up/down counter then the counter counts up until the values are equal. If the value of the volume control register is smaller than the value of the up/down counter then the counter counts down until the values are equal. If the value of the volume control register is equal to the value of the up/down counter then the counter maintains its state. The clock signal input to the counter is varied so that the user may select between a near-linear change in the D/A output envelope or a logarithmic change.

7 Claims, 7 Drawing Sheets

SYSTEM AND METHOD FOR ELECTRONIC VOLUME CONTROL OF AUDIO SIGNALS

BACKGROUND OF THE INVENTION

1. Field of the invention

The present invention relates to an audio volume control device, and more particularly to an electronic volume control for an audio device.

2. Description of the Prior Art

Conventional electronic volume controls for electronically controlling the sound level operate by storing the volume control level as a digital value, and directly controlling a digital/analog (D/A) converter according to the stored value.

Figure 9:
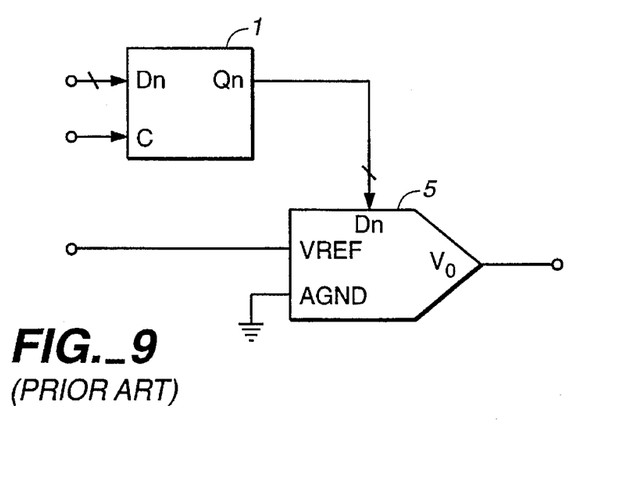
FIG. 9 is a block diagram of an electronic volume control according to the prior art.

FIG. 9 is a block diagram of a conventional electronic volume control comprising a volume control register 1 and a D/A converter 5. The volume value Dn applied to volume control register 1 by a host computer or other external input device is latched by the assertion of write clock C. The output value Qn is applied to D/A converter 5 as volume value Dn.

Figure 10:
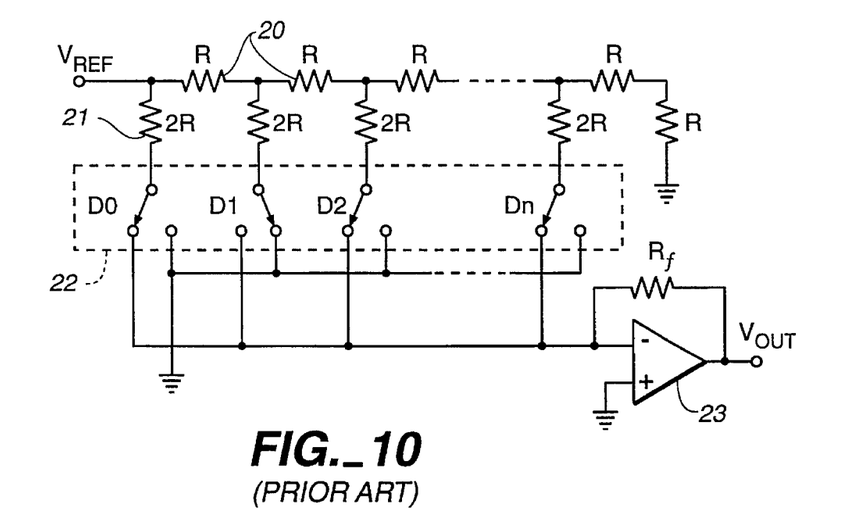
FIG. 10 is a circuit diagram of a conventional D/A converter.

A common D/A converter 5 is shown in FIG. 10. D/A converter 5 comprises plural resistors 20, 21, a switching circuit 22, and an operational amplifier (op amp) 23. D/A converter 5 is a standard current-type D/A converter using common ladder resistors. The value of resistors 20 is suitably set (=R), and the value of resistors 21 is set to twice the resistance of resistor 20 (=2R). Resistors 21 are connected by switching circuit 22 either directly to ground, or indirectly to ground (i.e., virtual ground). Op amp 23 is configured as an inverting amplifier with its non-inverting input tied to ground. It is well-known to those of ordinary skill in this field that an inverting amplifier configured in this way will produce substantially zero volts (i.e., virtual ground) at the inverting input terminal of op amp 23. By setting the resistance of resistors 20, 21 in this way, the current resulting from reference voltage $V_{REF}$ applied to the signal input terminal is divided at the branching point with half the current flowing to resistor 20 and half to resistor 21. Switching circuit 22 is switched according to the digital data stored in volume control register 1. D0, D1, D2, ... Dn are individual switches controlled by the various bits of the binary digital data where D0 is controlled by bit $2^n$, D1 by bit $2^{n-1}$, D2 by bit $2^{n-2}$, ... Dn by bit $2^{n-n}$ (=$2^0$). Relative to the current flowing through the switch controlled by the D0 bit, the current flowing through the D1-bit controlled switch is ½, and the current flowing through the D2-bit controlled switch is ¼. Thus, the current flowing through each switch is ½ the current flowing through the preceding switch.

The output $V_{OUT}$ of operational amplifier 23 can be defined as $$V_{OUT} = k \times (D/2^n) \times V_{REF}$$

where D is the digital value applied by D0, D1, D2, ... Dn, and k is a proportional constant. If the audio signal is input as reference voltage $V_{REF}$, an audio signal for which the volume is adjusted based on the digital value D can be obtained as the output.

Figure 11A:
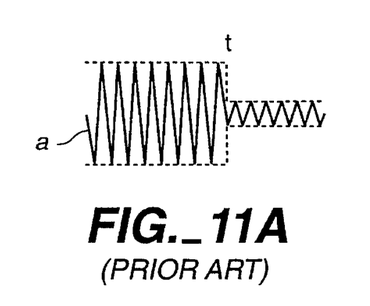
FIG. 11A is a graph of the change in the audio signal envelope when conventional volume control circuitry is used.

When the volume value is input to a conventional electronic volume control as shown in FIG. 9, the control data of the D/A converter also changes simultaneously at the write clock by which volume control register 1 reads the input data. This causes a sharp drop in the envelope of sound wave a at read time t as shown in FIG. 11A. Audible switching noise is thus created, and control of such audio effects as fade-in and fade-out becomes significantly more difficult.

SUMMARY OF THE INVENTION

Therefore, an object of the present invention is to provide an electronic volume control for reducing audible noise when the volume is changed by absorbing over time the rapid change in the sound wave envelope caused by volume adjustment.

Briefly, an electronic volume control according to the present invention comprises a volume control register for storing a digital value used for volume control, an up-down counter for counting a base clock signal, a comparator for comparing the value stored in the volume control register with the output from the up-down counter, a control circuit for controlling the count operation of the up-down counter based on the result of the comparison returned by the comparator, and a digital/analog converter to which an audio input signal is input to the reference voltage terminal and digital data is received from the output terminal of the up-down counter.

In a second embodiment of the present invention a volume control register for storing a digital value used for volume control, a multiple stage frequency divider for frequency dividing the base clock signal, a selector for selecting the output of the multiple stage frequency divider, an up-down counter for counting the signal selected by the selector as the clock signal, a comparator for comparing the value stored in the volume control register with the output from the up-down counter, a control circuit for controlling the count operation of the up-down counter based on the result of the comparison returned by the comparator, and a digital/analog converter to which an audio input signal is input to the reference voltage terminal and digital data is received from the output terminal of the up-down counter are used.

Fine adjustment of the quantization steps is made possible by inputting the count output by the up-down counter into the D/A converter. As a result, as shown in FIG. 11A, when the digital value for volume control is changed, the volume of the audio signal can be changed according to the count time, thus avoiding any sharp change in the sound wave envelope at volume adjustment of the audio signal, and reducing the audible switching noise in the audio output.

By frequency dividing the clock signal in multiple stages and variably selecting the frequency divided output, the time period for the total envelope change can be adjusted. By selecting the frequency divider output based on the count output from the up-down counter, the envelope change can be made volume-dependent. This change can also be made logarithmic.

It is also possible to selectively apply linear change and volume-dependent change of the envelope.

Other objects, advantages and attainments together with a fuller understanding of the invention will become apparent and appreciated by referring to the following description and claims taken in conjunction with the accompanying drawings.

DETAILED DESCRIPTION OF THE INVENTION

First Embodiment—Structure

Figure 1:
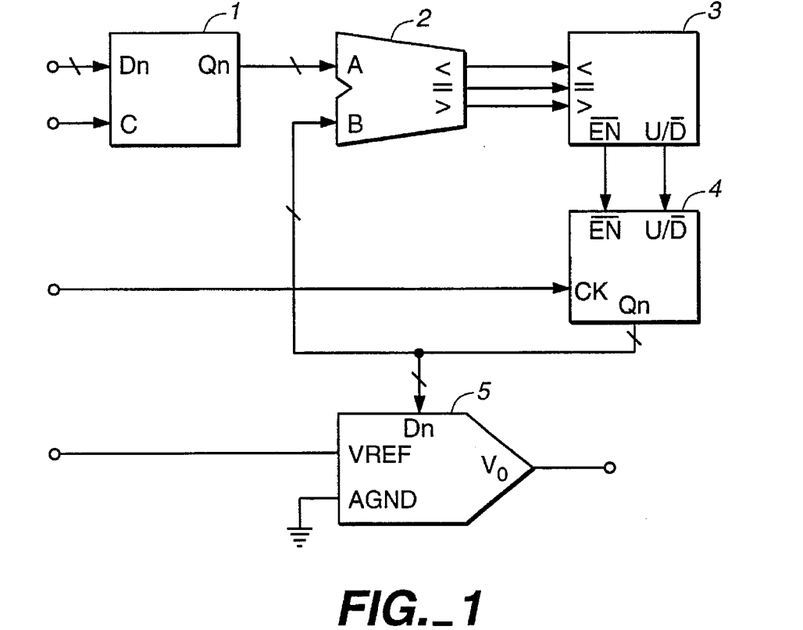
FIG. 1 is a block diagram of an electronic volume control according to a first embodiment of the invention.

Referring to FIG. 1, this electronic volume control includes volume control register 1, comparator 2, control circuit 3, up-down counter 4, and D/A converter 5. The volume value Dn applied to volume control register 1 by a host computer or other external input device is latched by the assertion of write clock C. Comparator 2 compares the volume value Dn stored in volume control register 1 with the count output from up-down counter 4 to control an envelope change, and outputs to control circuit 3 whether the volume value and count are equal or which is greater. Based on the result received from comparator 2, control circuit 3 controls the count enable state and the count-up or count-down operation of up-down counter 4. Up-down counter 4 is a 6-bit counter, but the invention is not so limited. D/A converter 5 can be identical to that described above with reference to FIG. 10, but is not so limited.

First Embodiment—Operation

While the initial value of the up-down counter count can be any desired value, a high volume is generally not desirable for the initial audio output. A value of 000000 or a similarly small value is therefore used. This volume value is then applied to terminal Dn of volume control register 1, and latched in volume control register 1 when the write clock, coupled to terminal C, is asserted. The stored volume value Dn is output to terminal Qn of volume control register 1. Comparator 2 constantly compares the output Qn of volume control register 1, coupled to terminal A of comparator 2, with the output of up-down counter 4, coupled to terminal B of comparator 2, and outputs the results of three comparisons: A<B, A=B, and A>B. Control circuit 3 controls up-down counter 4 based on the results output from comparator 2 as follows:

(1) If A<B, then count down;

(2) If A=B, then stop counting;

(3) If A>B, then count up.

The base clock is input to terminal CK of up-down counter 4. For example, if the volume of the audio output is set to a certain level and a volume value Dn less than this volume is input to volume control register 1, the result returned by comparator 2 will be A<B. As a result, up-down counter 4 counts down using the base clock as its clock input. A gradually decreasing digital value is thus input to terminal Dn of D/A converter 5 based on the count down value until the count is equal to the input volume value. The volume of the analog audio input is therefore gradually reduced, becoming a gradually dropping analog audio output. When the volume value Dn input to volume control register 1 is greater than the current volume, up-down counter 4 counts up, and the volume of the audio output gradually rises.

Figure 4:
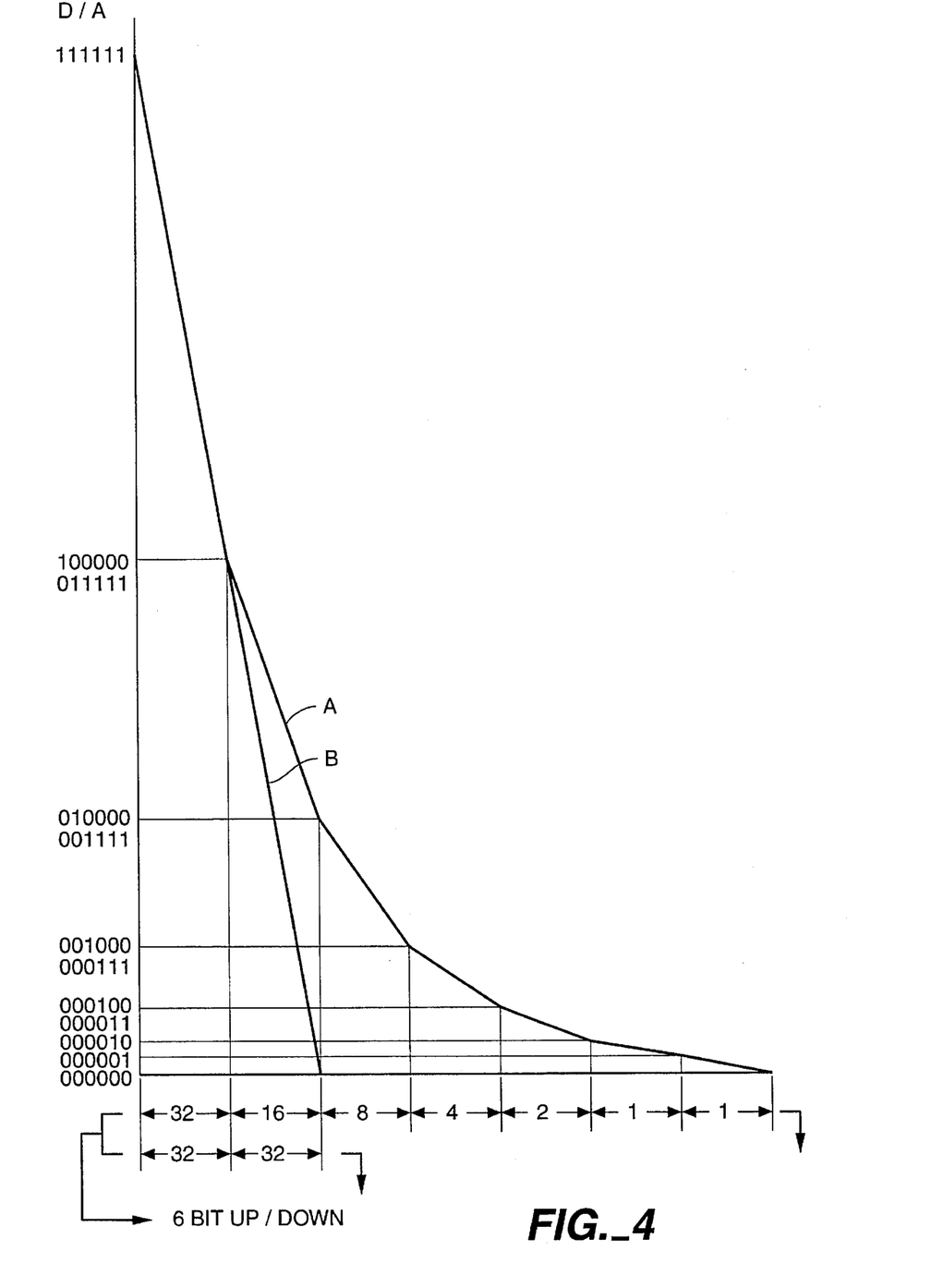
FIG. 4 is a graph of the time change of the digital input value of the D/A converter.

The rate of change in the volume value is determined by the frequency of the base clock. For example, if the base clock frequency is 32 Hz, the change in the volume value will follow line B in FIG. 4. Thus, if the current volume is 111111 and the new volume value Dn latched in volume control register 1 is 000000, the time required for up-down counter 4 count to change from 111111 to 000000 will be approximately 2 seconds (i.e., 63 cycles at 32 Hz—$63/32$ seconds—1.96875 seconds). Similarly, if the current volume is 100000 and the new volume value Dn latched in volume control register 1 is 010000, the time required for up-down counter 4 to change from 100000 to 010000 will be 0.5 seconds (i.e., 16 cycles at 32 Hz=$16/32$ seconds=0.5 seconds).

Figure 11B:
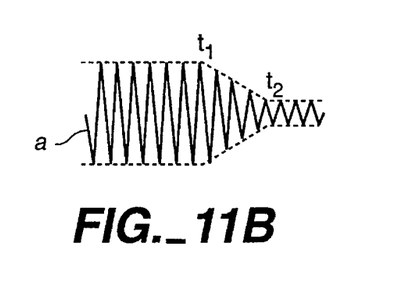
FIG. 11B is a graph of the change in the audio signal envelope when the present invention is used.

The change in the audio signal envelope obtained with this change in the volume value is shown in FIG. 11B. Even if the volume control signal indicates a sudden cut off of sound wave a at time $t_1$, there is a gradual approximately linear change in the envelope and the new volume is obtained at time $t_2$. It is thus possible to reduce switching noise in the audio output.

The volume value can be manually applied by means of a control button, or under software control by a computer as in a computer game in which the audio output signal is related to a displayed image. The write clock, base clock, and audio input are asynchronous. When the write clock is synchronously applied, the write clock cycle is set longer than the switching completion time of the volume value, i.e., longer than the full count time of up-down counter 4.

Second Embodiment

Figure 2:
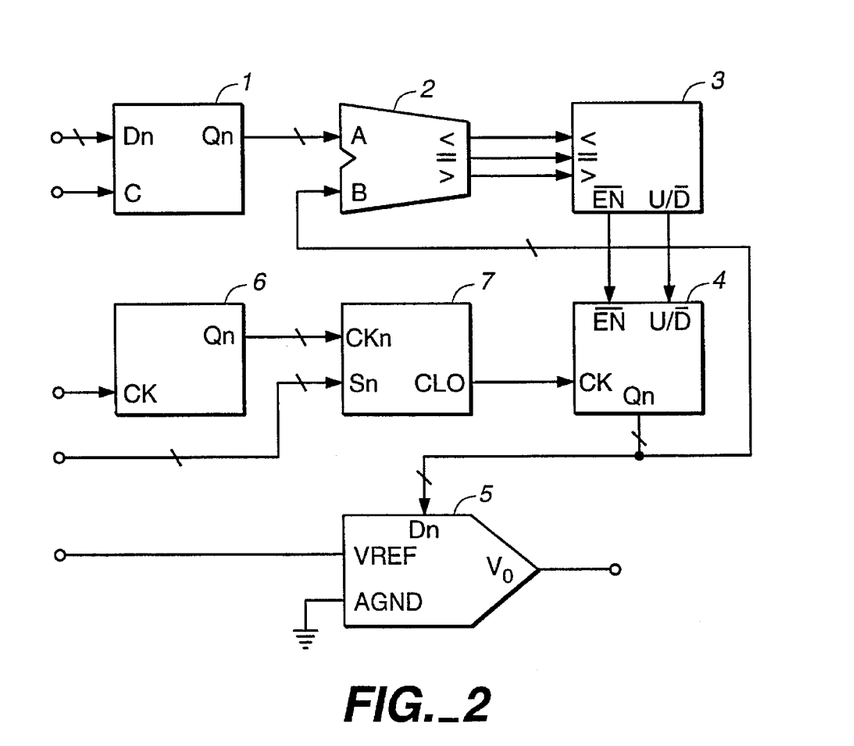
FIG. 2 is a block diagram of an electronic volume control according to a second embodiment of the invention.

Like parts in FIGS. 1 and 2 are indicated by like reference numerals, and further description is omitted below.

Referring to FIG. 2, this embodiment further comprises frequency divider 6 and selector 7. In this embodiment the base clock is frequency divided into multiple stages by frequency divider 6, and a frequency is selected by selector 7 to select the frequency of the clock applied to up-down counter 4. As a result, because the rate of change in the volume value is controlled by the frequency of up-down counter clock, the rate of change in the volume value can be changed by changing the frequency of the up-down counter clock. The selector signal applied to terminal Sn of selector 7 can be input either manually by an external control device, or under software control in a game as described above.

For example, frequency divider 6 may be several serially connected divide by two circuits. If the base clock frequency is 32 Hz as above, the time required to change from 111111 to 000000 will be approximately 2 seconds at a 32 Hz clock, approximately 4 seconds at a 16 Hz clock and approximately 8 seconds at an 8 Hz clock.

Third Embodiment

Figure 3:
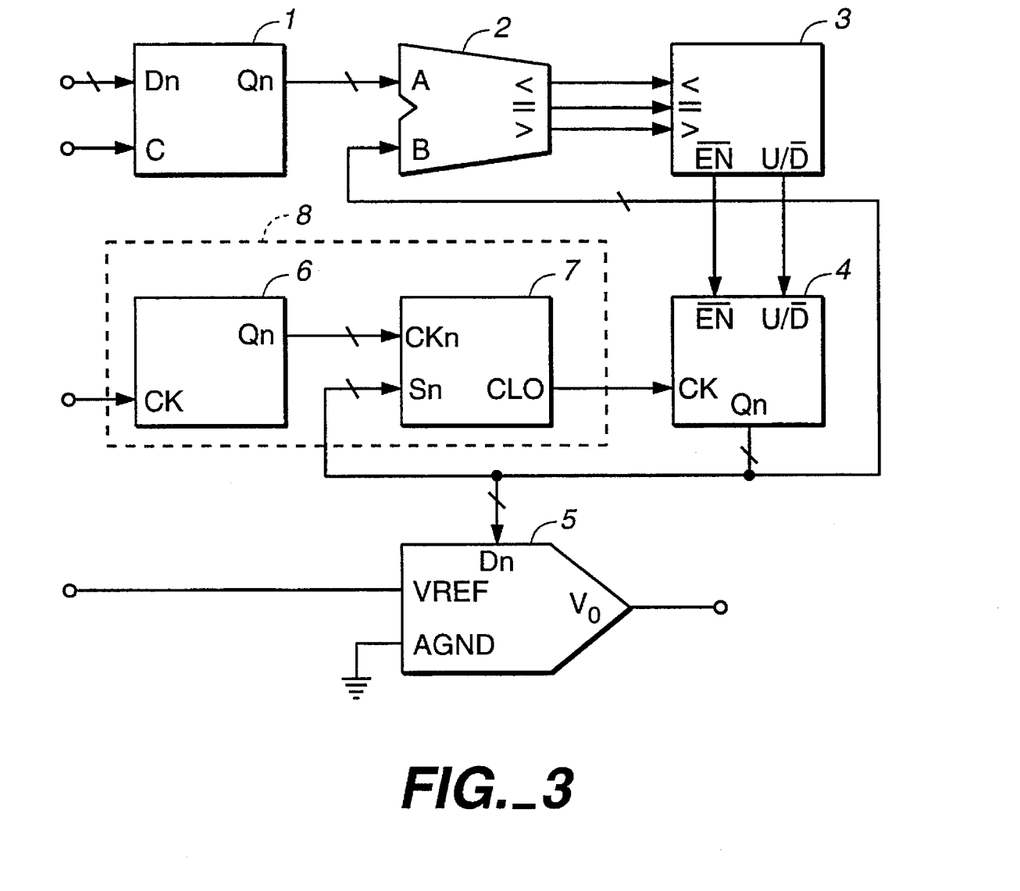
FIG. 3 is a block diagram of an electronic volume control according to a third embodiment of the invention.

Like parts in FIGS. 1, 2, and 3 are indicated by like reference numerals, and further description is omitted below.

As shown in FIG. 3, this embodiment further comprises pseudo-logarithmic clock generator 8. Selector 7 of the second embodiment operates according to the count from up-down counter 4. The characteristics of the change in the volume can thus be controlled as desired by manipulating the frequency divided frequency of frequency divider 6 and the count of up-down counter 4.

Pseudo-logarithmic clock generator 8 can be achieved by using multiple divide by two stages for frequency divider 6 as described in the second embodiment, and controlling selector 7 to select the ½ frequency divided frequency each time the count becomes ½ the full count. This characteristic is shown by line A in FIG. 4. Specifically, the 32 Hz frequency is selected for a volume change from 111111 to 100000 and this change takes 1 second. To change from a volume value of 100000 to 010000, the 16 Hz frequency is selected and this change takes approximately 1 second. To change from a volume value of 010000 to 001000, the 8 Hz frequency is selected and this change takes 1 second. The full count time required to lower the volume from 111111 to 000000 requires approximately 7 seconds using the pseudo-logarithmic characteristic of this example.

Figure 5:
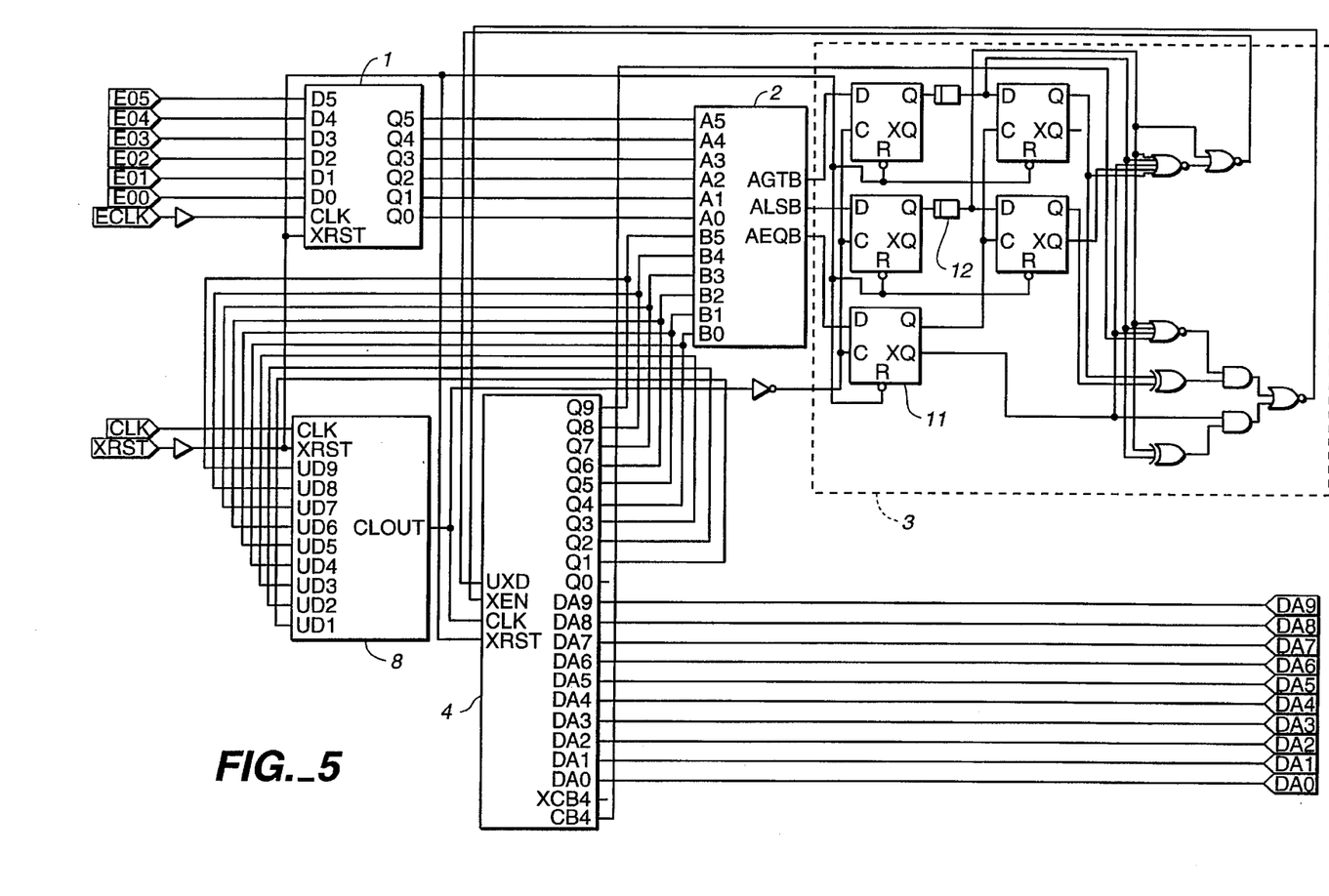
FIG. 5 is a circuit diagram of the digital section of a pseudo-logarithmic electronic volume control according to the third embodiment of the invention.

FIG. 5 shows an example of the digital section of the pseudo-logarithmic electronic volume control of the third embodiment. Like parts in FIGS. 3 and 5 are indicated by like reference numerals. As shown in FIG. 5, this digital section comprises a D-flip-flop 11 and a delay circuit 12. A reset signal XRST, a write clock ECLK, a volume value ED5~ED0, and a base clock signal CLK are also shown. As described with reference to FIG. 3, volume value ED5~ED0 is latched when write clock ECLK is asserted, and the stored values Q5~Q0 are input to A5~A0 of comparator 2. The count outputs from up-down counter 4 are input to B5~B0 of comparator 2. If A5~A0>B5~B0, then output signal AGTB is asserted; if A5~A0<B5~B0, then output ALSB is asserted; and if A5~A0=B5~B0, then output AEQB is asserted. The outputs of comparator 2 (AGTB, ALSB, AEQB) are input to control circuit 3. Based on the result output from comparator 2, control circuit 3 outputs the enable signal and up/down signal to terminals XEN and UXD respectively, of up-down counter 4.

Figure 6:
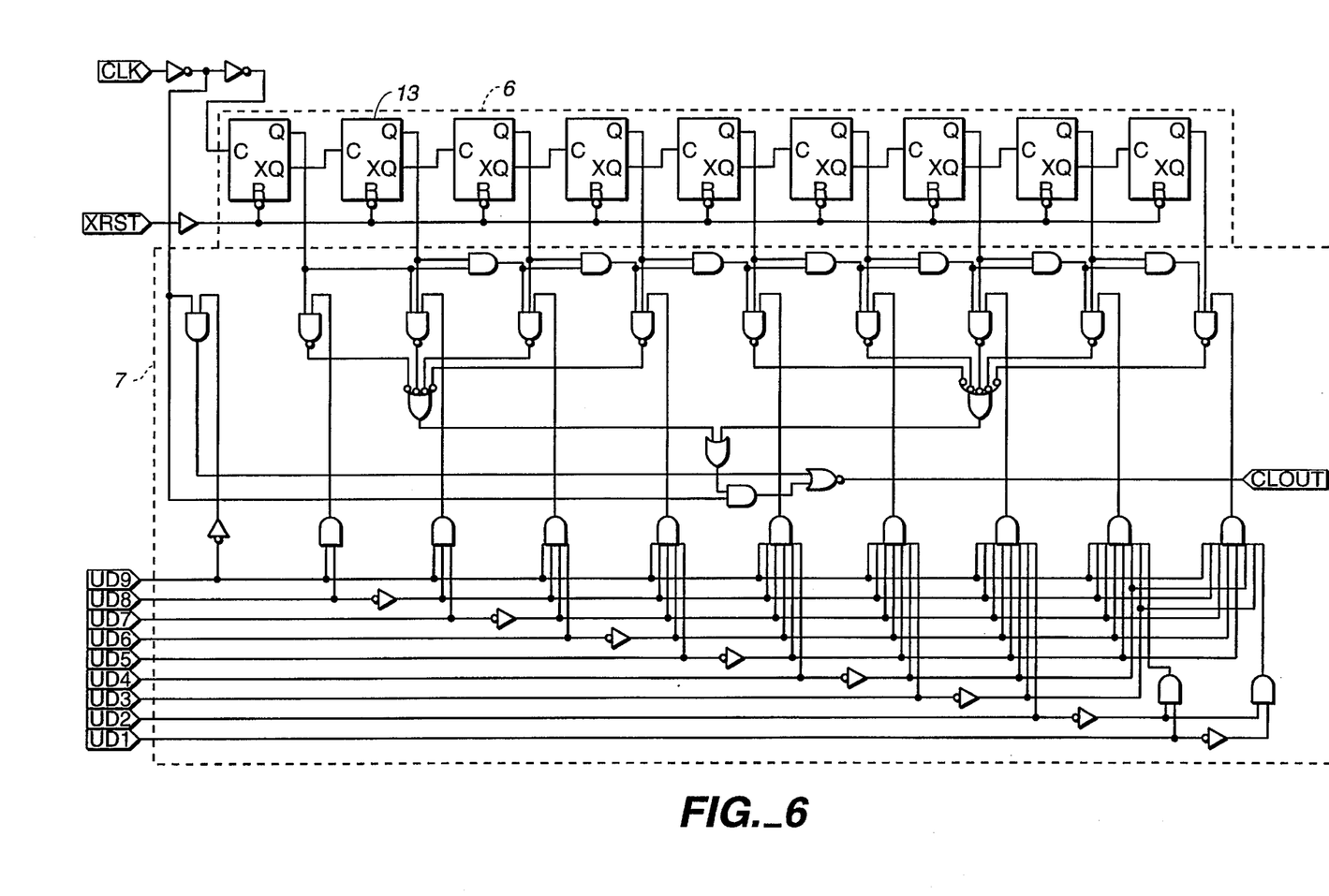
FIG. 6 is a detailed circuit diagram of the pseudo-logarithmic clock generator.

FIG. 6 is a detailed diagram of the pseudo-logarithmic clock generator showing frequency divider 6, selector 7, and T-flip-flops 13. Frequency divider 6 comprises a plurality of T-flip-flops 13 connected in serial stages. This circuit configuration divides the base clock CLK by one-half at each stage. One of the frequency divided outputs from frequency divider 6 is selected by selector 7 based on the count UD9~UD1 of the up-down counter controlling the change in the envelope, and the selected signal CLOUT is input to up-down counter 4 (see FIG. 5) as the base clock CLK.

Fourth Embodiment

Figure 7:
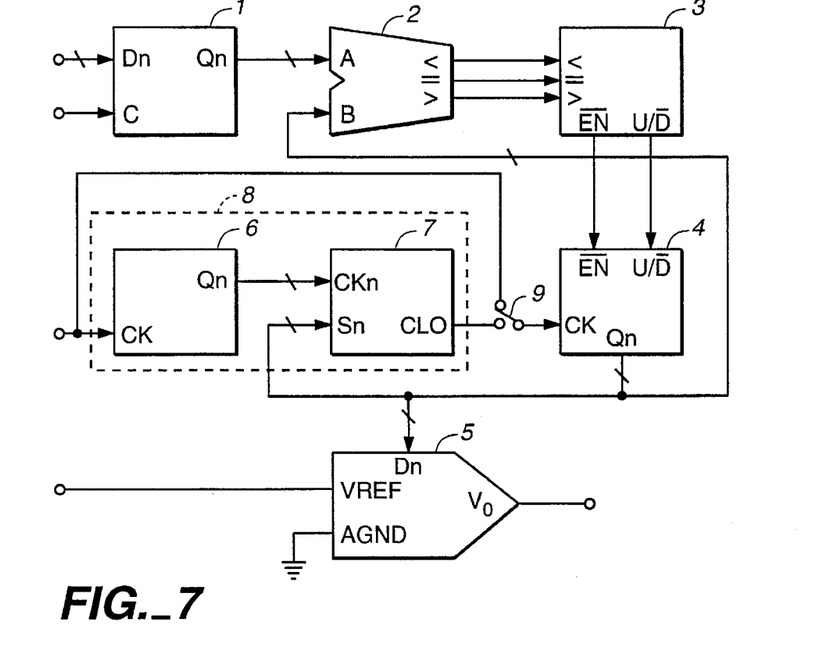
FIG. 7 is a block diagram of an electronic volume control according to a fourth embodiment of the invention.

Like parts in FIGS. 3 and 7 are indicated by like reference numerals. As shown in FIG. 7, this embodiment further comprises switching circuit 9. In this embodiment, either the base clock or the frequency divided signal selected by selector 7 as in the third embodiment is selected by switching circuit 9 for use as the clock signal of up-down counter 4. When the base clock is selected, linear change characteristics are obtained as described in the first embodiment. When the frequency divided signal selected by selector 7 is selected by switching circuit 9, pseudo-logarithmic change characteristics are obtained as described in the third embodiment. It is to be noted that a predetermined frequency divided signal output from frequency divider 6 can be selected in place of the base clock by switching circuit 9.

Fifth Embodiment

Figure 8:
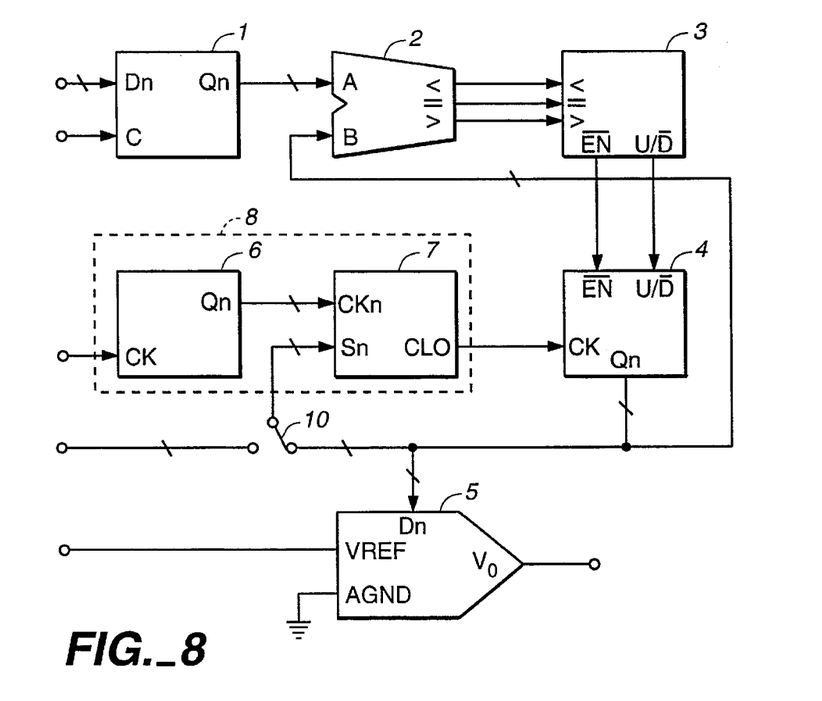
FIG. 8 is a block diagram of an electronic volume control according to a fifth embodiment of the invention.

Like parts in FIGS. 3 and 8 are indicated by like reference numerals. As shown in FIG. 8, this embodiment further comprises switching circuit 10. In this embodiment, operation corresponding to that of the second or third embodiment above can be selected by controlling switching circuit 10. Specifically, when switching circuit 10 is switched so that the selector signal is input to terminal Sn of selector 7, linear change characteristics are obtained. When switching circuit 10 is switched so that the count of up-down counter 4 is input to terminal Sn of selector 7, pseudo-logarithmic change characteristics are obtained.

Conclusion

While the invention has been described in conjunction with several specific embodiments, it is evident to those skilled in the art that many further alternatives, modifications and variations will be apparent in light of the foregoing description. For example, the particular output stage of the frequency divider which is selected can be based selectively on the state of the up/down counter or a predetermined value. Thus, the invention described herein is intended to embrace all such alternatives, modifications, applications and variations as may fall within the spirit and scope of the subjoined claims.

What is claimed is:

1. An electronic volume control comprising:

a) a volume control register for storing a digital value used for volume control;

b) an N-stage frequency divider, where N is an integer greater than or equal to one, each stage providing an output clock signal which is half the frequency of a previous stage, said frequency divider having an input terminal coupled to a base clock signal;

c) a selector, having a plurality of input terminals coupled to said N-stage frequency divider, that selects one output clock signal of said N-stage frequency divider and provides said selected signal as an output;

d) an up-down counter having an input clock terminal coupled to said output of said selector, and a plurality of output terminals for accessing a count value in said up/down counter;

e) a comparator, coupled to said volume control register and coupled to said up/down counter, for comparing said value in said volume control register with a value in said up/down counter;

f) a control circuit, coupled to said comparator, and coupled to said up/down counter, that enables up counting and down counting by said up/down counter; and g) a digital/analog converter having a reference voltage terminal to which an audio signal is coupled, and further having a plurality of digital data input terminals coupled to said up/down counter output terminals.

2. The electronic volume control of claim 1 wherein said selector has a plurality of selection control input terminals that are coupled to said up/down counter output terminals.

3. The electronic volume control of claim 1, wherein said selector has a plurality of selection control input terminals, and further comprising a switching circuit, said switching circuit coupled to said selection control input terminals, said up/down counter output terminals and coupled to a selector signal;

wherein said switching circuit can be configured to electrically couple one of said up/down counter and said selection signal to said selection control input terminal.

4. A method of controlling audio volume comprising the steps of:

a) providing a digital word having a value representative of the magnitude of an audio signal envelope;

b) latching said digital word in a volume control register having output terminals, such that said digital word appears at said volume control register output terminals;

c) providing an up/down counter having a clock signal input for controlling the rate of counting, and control signal inputs for enabling up counting and down counting;

d) providing a clock signal having a predetermined frequency to said up/down counter;

e) comparing the contents of said volume control register and said up/down counter;

f) providing control signals to said up/down counter that enable up counting if said volume control register contents are larger than the contents of said up/down counter;

g) providing control signals to said up/down counter that enable down counting if said volume control register contents are smaller than the contents of said up/down counter; and h) providing control signals to said up/down counter that disable counting if said volume control register contents are equal to the contents of said up/down counter.

5. The method of claim 4 further comprising a step of initializing said up/down counter to a predetermined value.

6. The method of claim 4 further comprising a step of changing said clock signal frequency during a period wherein said up/down counter is enabled for counting.

7. The method of claim 6 wherein said step of changing said clock signal frequency comprises evaluating said up/down counter outputs and selecting a clock signal frequency proportional to the binary value of said up/down counter outputs.

* * * * *

UNITED STATES PATENT AND TRADEMARK OFFICE
CERTIFICATE OF CORRECTION

PATENT NO.      : 5,596,651
DATED           : January 21, 1997
INVENTOR(S)     : Hisashi Yamaguchi It is certified that an error appears in the above identified patent and that said Letters Patent is hereby corrected as shown below:

On the title page:

Item [73]: Foreign Application Priority Data, insert --June 23, 1993  Japan 5-176071--.

Signed and Sealed this

Fifteenth Day of July, 1997

*Attest:*

BRUCE LEHMAN

*Attesting Officer*     *Commissioner of Patents and Trademarks*